(12) United States Patent
Khandelwal et al.

(10) Patent No.: US 9,663,859 B2
(45) Date of Patent: May 30, 2017

(54) INTELLIGENT HARDSTOP FOR GAP DETECTION AND CONTROL MECHANISM

(71) Applicant: Applied Materials, Inc., Santa Clara, CA (US)

(72) Inventors: Somesh Khandelwal, Sunnyvale, CA (US); Garry K. Kwong, San Jose, CA (US); Kevin Griffin, Livermore, CA (US); Joseph Yudovsky, Campbell, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 15/001,672

(22) Filed: Jan. 20, 2016

(65) Prior Publication Data

US 2016/0215396 A1    Jul. 28, 2016

Related U.S. Application Data

(60) Provisional application No. 62/106,505, filed on Jan. 22, 2015.

(51) Int. Cl.
| | | |
|---|---|---|
| *C23C 16/52* | (2006.01) | |
| *C23C 16/54* | (2006.01) | |
| *H01L 21/67* | (2006.01) | |
| *C23C 16/455* | (2006.01) | |
| *G01D 5/34* | (2006.01) | |
| *G01B 11/14* | (2006.01) | |

(52) U.S. Cl.
CPC .......... *C23C 16/52* (2013.01); *C23C 16/455* (2013.01); *G01B 11/14* (2013.01); *G01D 5/34* (2013.01); *H01L 21/67259* (2013.01)

(58) Field of Classification Search
None
See application file for complete search history.

(56) References Cited

U.S. PATENT DOCUMENTS

| | | | |
|---|---|---|---|
| 4,723,084 A * | 2/1988 | Reynolds | ............... H01R 39/58 |
| | | | 310/242 |
| 5,373,153 A | 12/1994 | Cumberledge | |
| 5,971,701 A | 10/1999 | Kawamura | |

(Continued)

FOREIGN PATENT DOCUMENTS

| | | |
|---|---|---|
| KR | 2020000015192 | 7/2000 |
| KR | 2020120001661 | 3/2012 |

(Continued)

OTHER PUBLICATIONS

Poodt, Paul, et al., High-Speed Spatial Atomic-Layer Deposition of Aluminum Oxide Layers for Solar Cell Passivation, *Advanced Materials*, 22 2010, 3564-3567.

(Continued)

*Primary Examiner* — Karla Moore
(74) *Attorney, Agent, or Firm* — Servilla Whitney LLC

(57) ABSTRACT

Apparatus and methods for measuring the proximity between two components using a hardstop, an actuator and an emitter/detector passing light through a passage in the actuator are disclosed. The passage provides attenuation to the light which changes as the gap between the components changes allowing the measurement and control of the gap. Methods of determining the topology of the components using the apparatus are also described.

9 Claims, 7 Drawing Sheets

(56) References Cited

U.S. PATENT DOCUMENTS

| | | |
|---|---|---|
| 6,821,563 B2 | 11/2004 | Yudovsky |
| 7,858,525 B2 | 12/2010 | Dominguez |
| 2003/0150123 A1 | 8/2003 | Fan |
| 2003/0155076 A1 | 8/2003 | Murakami |
| 2004/0052972 A1 | 3/2004 | Schmitt |
| 2004/0206921 A1 | 10/2004 | Blonigan |
| 2005/0238889 A1 | 10/2005 | Iwamoto et al. |
| 2006/0054090 A1 | 3/2006 | Kurita |
| 2008/0237861 A1 | 10/2008 | Dominguez et al. |
| 2009/0211707 A1 | 8/2009 | Chao |
| 2010/0136773 A1 | 6/2010 | Akae |
| 2010/0248397 A1 | 9/2010 | Newman |
| 2011/0236599 A1 | 9/2011 | Furuta |
| 2011/0315320 A1 | 12/2011 | Do |
| 2012/0075460 A1* | 3/2012 | Aikawa .................. C23C 16/44 348/87 |
| 2012/0225195 A1 | 9/2012 | Yudovsky |
| 2012/0225207 A1 | 9/2012 | Yudovsky |
| 2013/0269599 A1 | 10/2013 | Lin |

FOREIGN PATENT DOCUMENTS

| | | |
|---|---|---|
| KR | 101134277 | 4/2012 |
| WO | 2012/118953 | 9/2012 |
| WO | 2014/130673 A1 | 8/2014 |
| WO | 2014/144533 A1 | 9/2014 |

OTHER PUBLICATIONS

PCT International Search Report and Written Opinion in PCT/US2016/014039, dated Apr. 29, 2016, 9 pages.

\* cited by examiner

INTELLIGENT HARDSTOP FOR GAP DETECTION AND CONTROL MECHANISM

CROSS-REFERENCE TO RELATED APPLICATIONS

This application claims priority to U.S. Provisional Application No. 62/106,505, filed Jan. 22, 2015, the entire content of which is hereby incorporated by reference herein.

BACKGROUND

Embodiments of the present disclosure generally relate to an apparatus for processing substrates. More particularly, the disclosure relates to a batch processing platform for performing atomic layer deposition (ALD) and chemical vapor deposition (CVD) on substrates.

The process of forming semiconductor devices is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50 are processed in a given chamber simultaneously. Batch processing is especially beneficial for processes that are too time-consuming to be performed on individual substrates in an economically viable manner, such as for ALD processes and some chemical vapor deposition (CVD) processes.

The semiconductor industry's tolerance for process variability continues to decrease as the size of semiconductor devices shrink. To meet these tighter process controls, the industry has developed a host of new processes which meet the tighter process window requirements, but these processes often take a longer time to complete. For example, ALD is a variant of CVD that demonstrates superior step coverage compared to CVD. ALD is based upon atomic layer epitaxy (ALE) that was originally employed to fabricate electroluminescent displays. ALD employs chemisorption to deposit a saturated monolayer of reactive precursor molecules on a substrate surface. This is achieved by cyclically alternating the pulsing of appropriate reactive precursors into a deposition chamber. Each injection of a reactive precursor is typically separated by an inert gas purge to provide a new atomic layer to previous deposited layers to form a uniform material layer on the surface of a substrate. Cycles of reactive precursor and inert purge gases are repeated to form the material layer to a predetermined thickness. The biggest drawback with ALD techniques is that the deposition rate is much lower than typical CVD techniques by at least an order of magnitude. For example, some ALD processes can use a chamber processing time from about 10 to about 200 minutes to deposit a high quality layer on the surface of the substrate. In choosing such ALD and epitaxy processes for better device performance, the cost to fabricate devices in a conventional single substrate processing chamber would increase due to very low substrate processing throughput. Hence, when implementing such processes, a continuous substrate processing approach is needed to be economically feasible.

New generations of ALD process tools benefit from tight control of the gap between the wafer and the deposition source (injector) to meet composition and thickness uniformity across the wafer and between wafers. The process may take place in a wide range of temperatures, and in a range of separation between the wafer and the deposition source. It can be important to monitor the uniformity of the distance across the wafers area, which can be as large as 1.5 m in diameter. Also, the temperature range that the system works at might be adjusted for thermal expansion to meet the accuracy of wafer placement in the process pockets.

Therefore, there is an ongoing need in the art for apparatus and methods providing control over the injector to susceptor gap over large temperature ranges.

SUMMARY

Some embodiments of the disclosure are directed to apparatus comprising a hardstop having a body with a top portion with a top end, a bottom portion with a bottom end and an opening extending from the top end to the bottom end. An actuator has a body with an upper portion with an upper end and a lower portion with a lower end. The upper portion has a passage extending through the body. The passage has a first end and a second end. The actuator is sized to be slidably positioned within the opening of the hardstop so that the lower end of the actuator protrudes from the bottom end of the hardstop a first distance when no force is applied to the lower end of the actuator. An emitter is aligned with the first end of the passage in the actuator. A detector is aligned with the second end of the passage in the actuator.

Additional embodiments of the disclosure are directed to apparatus comprising a hardstop having a body with a top portion with a top end, a bottom portion with a bottom end and an opening extending from the top end to the bottom end. An actuator has a body with an upper portion with an upper end and a lower portion with a lower end. The upper portion has a passage extending through the body. The passage has a first end and a second end. The actuator is sized to be slidably positioned within the opening of the hardstop so that the lower end of the actuator protrudes from the bottom end of the hardstop a first distance when no force is applied to the lower end of the actuator. An O-ring is between the hardstop and the actuator. The O-ring forms a fluid tight seal between the hardstop and the actuator. A plate is adjacent to the hardstop. A spring is positioned between the hardstop and the plate. An emitter is aligned with the first end of the passage in the actuator. A detector is aligned with the second end of the passage in the actuator. Pressure applied to the lower end of the actuator causes the actuator to slide within the opening in the hardstop so that the spring is at maximum compression and the lower end of the actuator protrudes from the bottom end of the hardstop a second distance which is shorter than the first distance. The passage causes a change in attenuation of light transmitted through the passage from the emitter to the detector from a first attenuation to a second attenuation.

Further embodiments of the disclosure are directed to methods comprising measuring a first amount of light transmitted from an emitter to a detector through a passage in a top portion of an actuator. The actuator extends through a gas distribution assembly into a gap between the gas distribution assembly and a susceptor assembly. The gap between the susceptor assembly and the gas distribution assembly is decreased. A second amount of light transmitted from the emitter to the detector is measured after the gap is decreased. The gap between the gas distribution assembly and the susceptor assembly is determined based on the first amount of light and the second amount of light.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure are directed to apparatus and methods for measuring the gap between the injector assembly and substrate or susceptor assembly. Some embodiments of the disclosure are directed to apparatus and methods for placing a wafer on a susceptor assembly in a reproducible manner. One or more embodiments of the disclosure are directed to apparatus and methods for measuring the temperature of a susceptor assembly. Some embodiments of the disclosure provide static and dynamic 3D mapping of the gap across the plating area, as well as direct temperature measurement and on the fly adjustment of wafer placement coordinates using cameras, capacitance sensors and design elements to enable monitoring various parameters.

As used in this specification and the appended claims, the terms "wafer", "substrate" and the like are used interchangeably. In some embodiments, the wafer is a rigid, discrete substrate, for example, a 200 mm or 300 mm silicon wafer.

Embodiments of the disclosure can be used with any process which benefits from a vertical dimension control between a wafer and a process chamber fixture (e.g., a gas distribution showerhead) or between two process fixtures (e.g., a showerhead and a wafer pedestal). While the embodiments of the disclosure are described with respect to semiconductor processing equipment, the scope of the disclosure is not limited to semiconductor processing.

In some semiconductor processes, the gap between the gas distribution assemblies is a parameter which may be useful in controlling process uniformity. Process chamber fixtures, like shower heads can be precisely engineered to achieve and maintain a particular mechanical gap, but this gap can change. For example, the gap can change with temperature and, in cases where fixtures separate, when the process chamber is opened for service.

Furthermore, as wafers grow in size and throughput is maximized leads to multiple wafers being processed simultaneously, the substrate support apparatus/fixture size increases. In such systems there is a chance of significant droop along the wafer away from the location of support. The non-linear non-uniformity of the gap between the showerhead and the wafer pedestal (susceptor) can make determining and adjusting the gap at the center difficult. Limited space, high temperatures, plasma glow and electrical and mechanical interference from process hardware limit options for non-contact based proximity sensors within the chamber. Capacitive/inductive sensors are also prohibitively costly.

Figure 1:
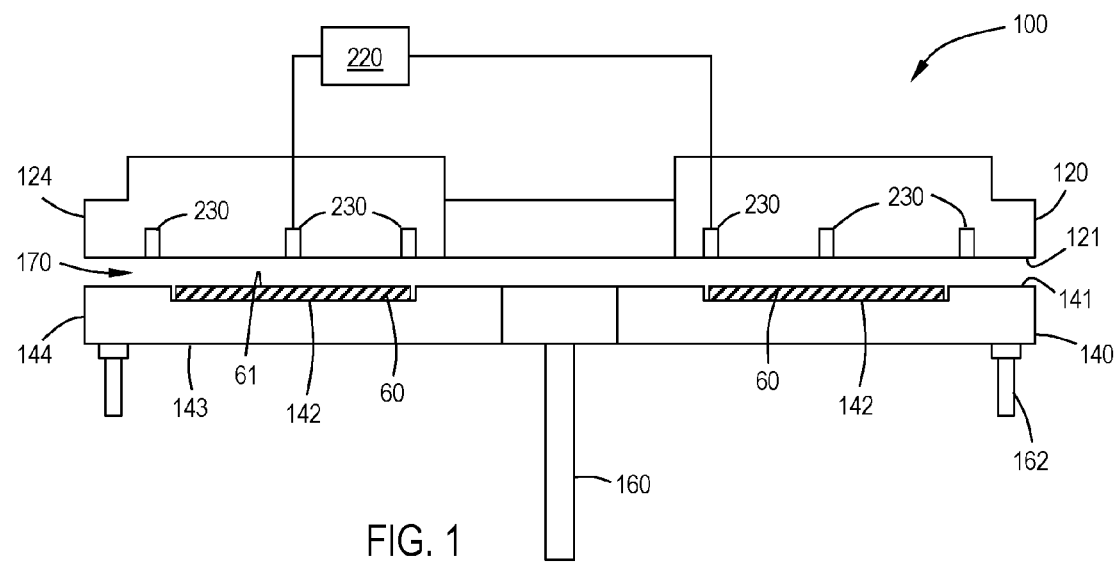
FIG. 1 is a cross-sectional side view of a processing chamber in accordance with one or more embodiment of the disclosure.

FIG. 1 shows cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which, in the embodiments, shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial ALD gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. The plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, forming a layer on the substrate surface.

Figure 2:
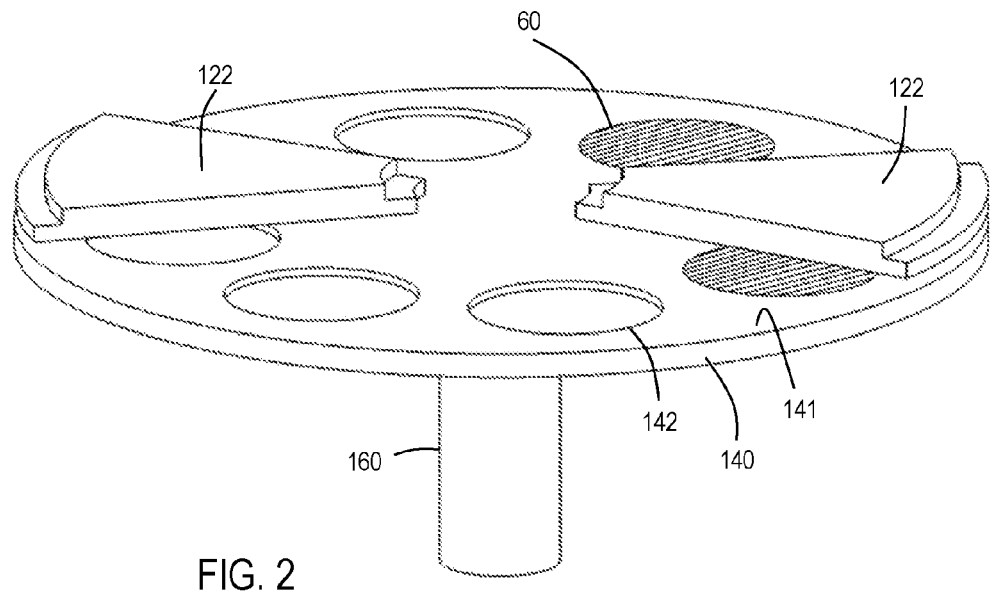
FIG. 2 shows a perspective view of a processing chamber with pie-shaped gas distribution sectors in accordance with one or more embodiments of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

The susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the wafers 60 being processed. In the embodiment shown in FIG. 1, the recess 142 has a flat bottom to support the bottom of the wafer, but it will be understood that the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a wafer 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas injector assembly.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of wafers 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload wafers 60.

Figure 4:
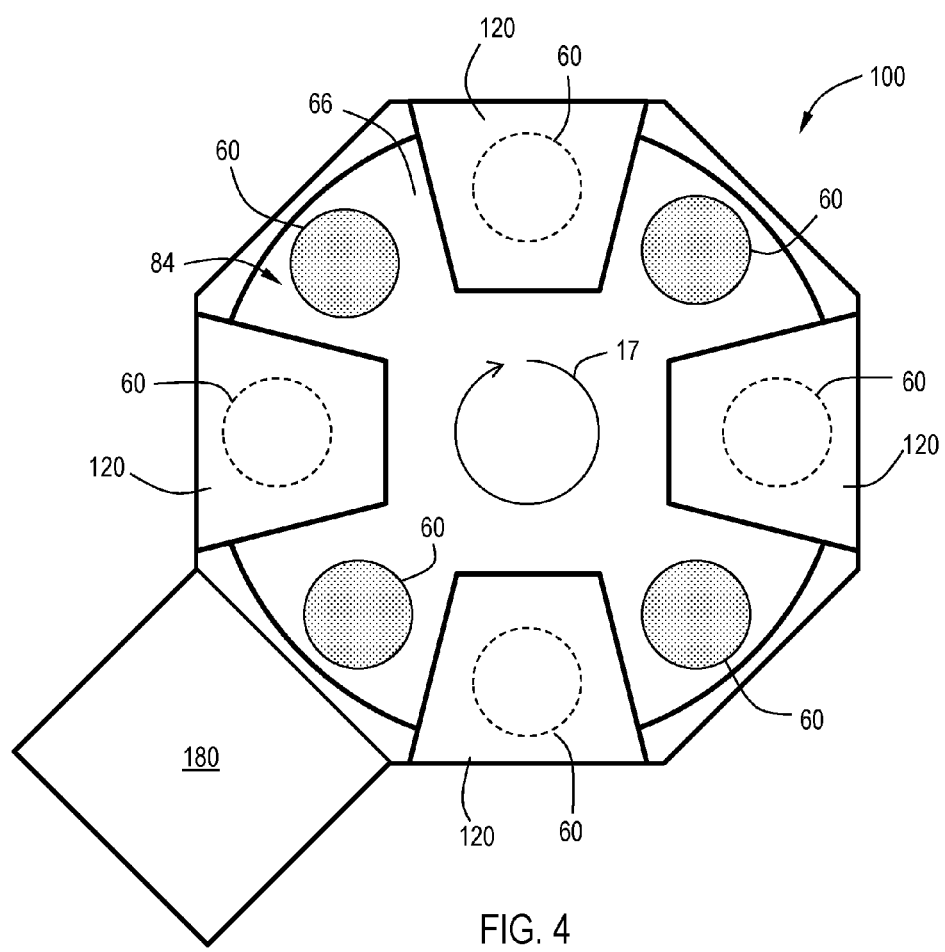
FIG. 4 is a schematic plan view of a substrate processing system configured with four gas distribution assemblies and a loading station in accordance with one or more embodiments of the disclosure.

Processing chambers having multiple gas injectors can be used to process multiple wafers simultaneously so that the wafers experience the same process flow. For example, as shown in FIG. 4, the processing chamber 100 has four gas injector assemblies and four wafers 60. At the outset of processing, the wafers 60 can be positioned between the injector assemblies 30. Rotating 17 the susceptor assembly 140 by 45° will result in each wafer 60 which is between injector assemblies to be moved to an injector assembly for film deposition, as illustrated by the dotted circle under the injector assemblies. An additional 45° rotation would move the wafers 60 away from the injector assemblies 30. With spatial ALD injectors, a film is deposited on the wafer during movement of the wafer relative to the injector assembly. In some embodiments, the susceptor assembly 140 is rotated in increments that prevent the wafers 60 from stopping beneath the injector assemblies. The number of wafers 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one.

The processing chamber 100 shown in FIG. 4 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 4 includes a load lock chamber 180, or an auxiliary chamber like a buffer station. This chamber 180 is connected to a side of the processing chamber 100 to allow, for example the substrates (also referred to as wafers 60) to be loaded/unloaded from the chamber 100. A wafer robot may be positioned in the chamber 180 to move the substrate onto the susceptor.

Rotation of the carousel (e.g., the susceptor assembly 140) can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where it can pause again. Pausing between the injectors may provide time for additional processing steps between each layer deposition (e.g., exposure to plasma).

Figure 3:
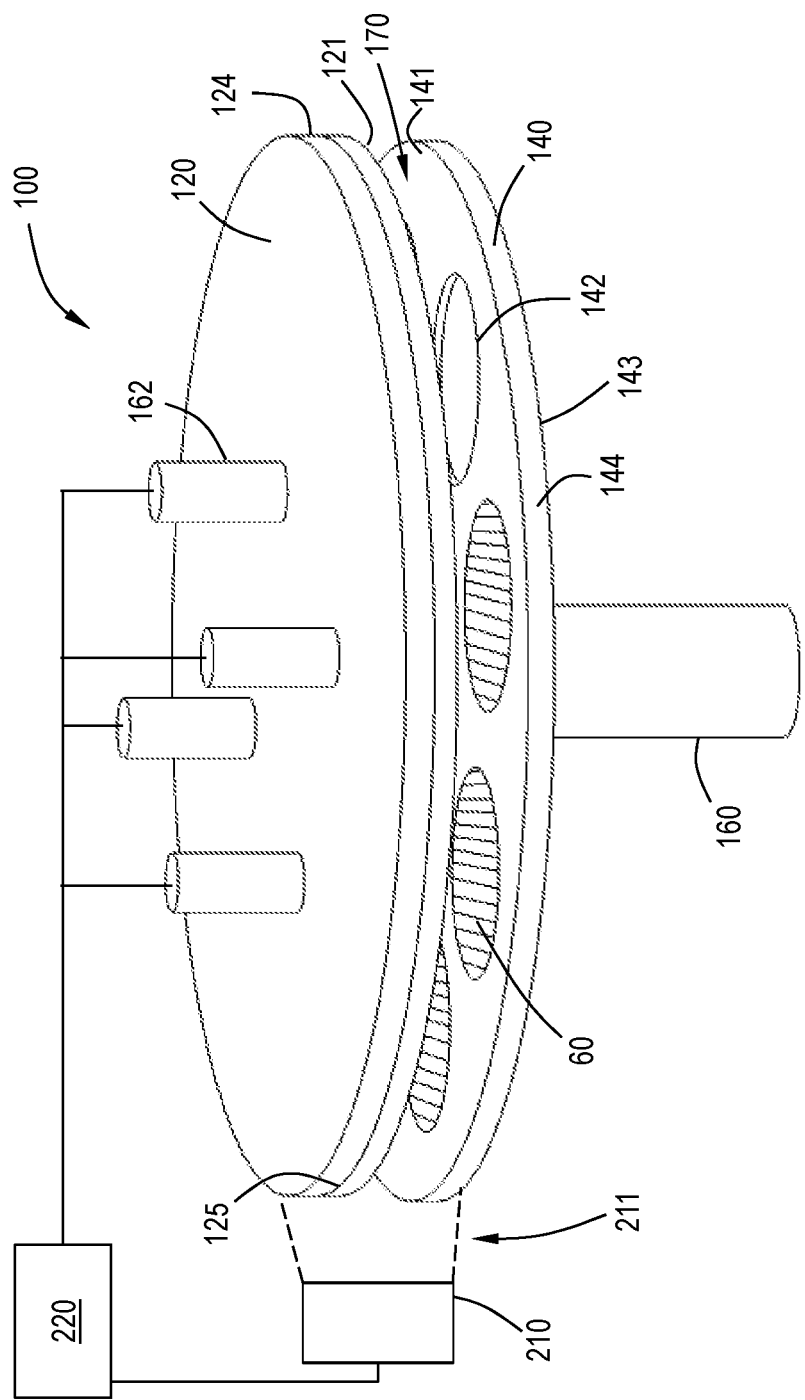
FIG. 3 shows a perspective view of a processing chamber in accordance with one or more embodiments of the disclosure.

One or more embodiments of the disclosure can be used for gap 170 control. Referring to FIG. 3, gap 170 control can be achieved by using externally mounted CCD cameras 210 for image capture and processing, and/or capacitance sensors 230 (shown in FIG. 1) embedded inside the gas distribution assembly 120 or the plating platform (i.e., the susceptor assembly 140) for real time and continuous gap 170 measurement. As used in this specification and the appended claims, the term "image" refers to a two-dimensional array of data points obtained by an optical instrument, for example, a digital photograph that provides an actual visual representation of the subject matter being focused upon or within the field of view 211. In some embodiments, the entire image is captured in a single snapshot in time as opposed to a sequential or random series of measurements over the same physical space. An image may be an uninterrupted two-dimensional representation of the three-dimensional subject matter.

The cameras 210 can be mounted in, for example, three positions around the susceptor assembly 140, with a field of view 211 wide enough to simultaneously capture the edges of the gas injector plate and the susceptor that carries the wafer, face up against the gas flow from the injector. This allows the injector to perform as a reference point to measuring the gap. Using three cameras, a single image of both the gas injector plate and the susceptor assembly with a stationary susceptor allows for the determination of the plane formed by the carrier relative to the injector. This is useful to monitor tilt and offsets of the plating surface, and to enable adjustments and calibration of this gap. Measuring the position of the plating edge as the carrier rotates, allows for monitoring of dynamic gap non uniformity, as an example caused by wobbling during the rotation or non-uniform sagging of the carrier platform. The edges of the plates might be identified using image processing techniques to provide a 2D map of the static and dynamic dimension uniformity.

Accordingly, with reference to FIG. 3, one or more embodiments of the disclosure are directed to deposition chamber 100. The apparatus includes a gas distribution assembly 120 which has a front surface 121 and an edge 124. For ease of description, the gas distribution assembly 120 is shown as a disc-shaped unit, but those skilled in the art will understand that this can be a very irregular shape, especially on the top portion where gas lines may be connected.

The chamber 100 also includes a susceptor assembly 140 which is spaced from the gas distribution assembly 120. The susceptor assembly has a top surface 141, a bottom surface 143 and an edge 144. The space is referred to as the gap 170 and is the primary reactive region of the apparatus. The susceptor assembly 140 has support post 160 acting as a central axis about which the susceptor assembly 140 can rotate. The susceptor assembly 140 has a top surface 141 with a plurality of recesses 142, also referred to as pockets, sized to hold a plurality of substrates.

A camera 210 is positioned near the edges of the susceptor assembly and gas distribution assembly and has a field of view 211 including the edge 124 of the gas distribution assembly 120, the edge 144 of the susceptor assembly 140 and the gap 170. While only a single camera 210 is shown in FIG. 3, more than one camera 210 can also be employed. For example, since a minimum of three points are needed to define a plane, some embodiments of the disclosure use three cameras which, when analyzed can provide sufficient data to calculate a plane.

In some embodiments, the camera 210 has a field of view 211 that includes the edge 144 of the susceptor assembly 140. In embodiments of this sort, the camera 210 may be calibrated to a reference plane other than the gas distribution assembly 120. For example, the camera 210 may be calibrated to some reference plane not in the image (e.g., such as a mechanical standard plane). The gap can be calculated from the location of the susceptor edge 144 in relation to the standard plane.

The camera 210 is connected to a controller 220. The controller can be a computer with a memory for storing information and support circuits for analyzing data and communication with external devices, like the camera 210 or actuators 162. The controller evaluates the image from the camera 210 to determine the gap 170 between the top surface 141 of the susceptor assembly 140 and the front surface 121 of the gas distribution assembly 120.

The camera 210 generates an image which can be analyzed by the controller 220. During analysis, the controller 220 might detect the front edge of the gas distribution assembly, which correlates to the front surface 121 of the gas distribution assembly 120, and the top edge of the susceptor assembly 140, which correlates to the top surface of the 141 of the susceptor assembly 140. When the camera 210 is at a known distance from the gas distribution assembly 120, the number of pixels between the front edge of the gas distribution assembly and the top edge of the susceptor assembly are proportional to the size of the gap 170. The camera 210 may include a lens that can show the gap over a number of pixels. Meaning that the lens has sufficient resolution to show gap. The controller may count the number of pixels between the edges and compare the value to a look-up table for the given distance to the gas distribution assembly 120. While a look-up table technique is described, those skilled in the art will understand that there are other techniques for correlating the camera 210 image to the gap 170 size (e.g., a standardization equation).

Figure 5:
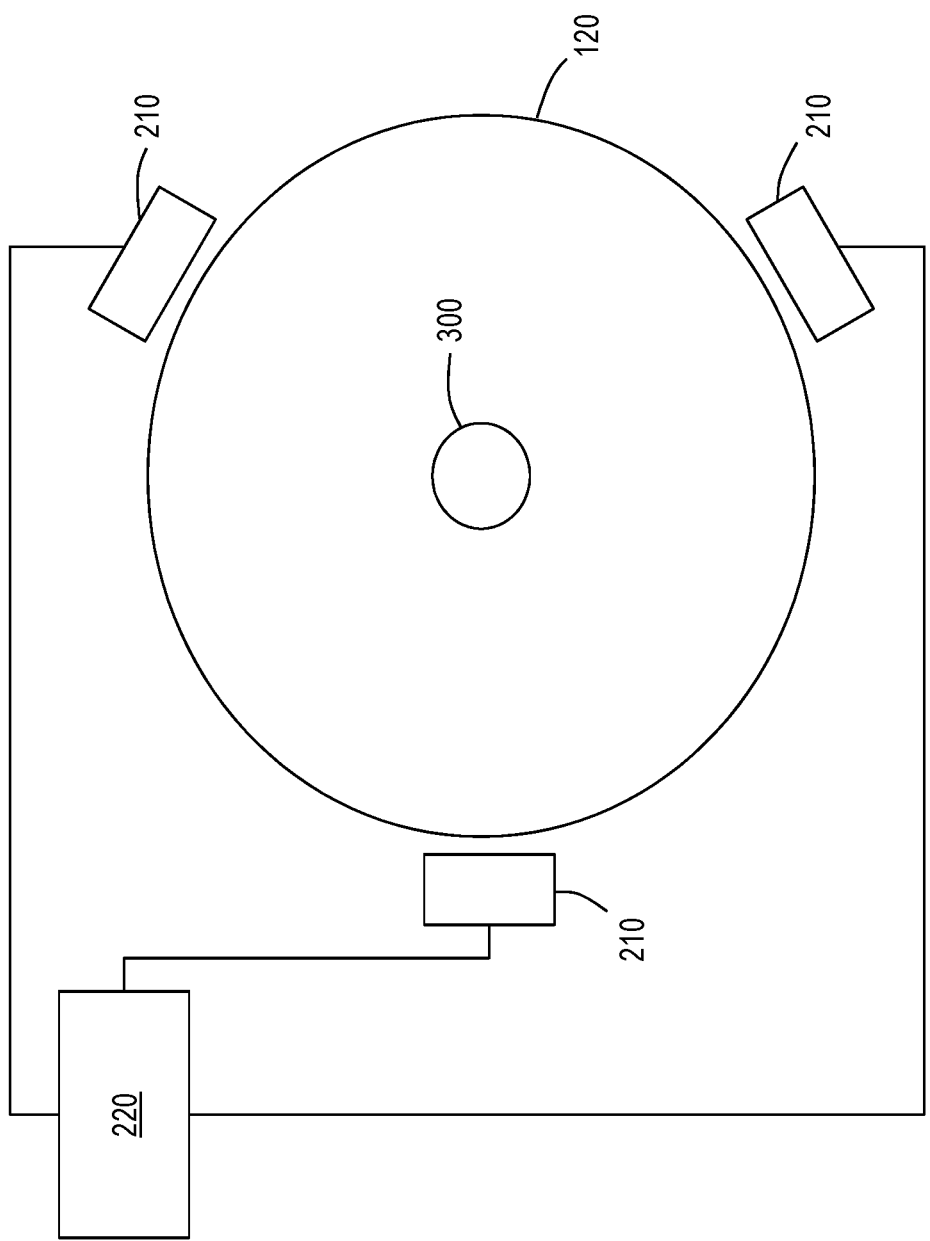
FIG. 5 is a schematic plan view of a processing system in accordance with one or more embodiments of the disclosure.

Referring to FIG. 5, in some embodiments, there are at least three cameras 210 spaced about an interior region of the deposition chamber 100. The embodiment shown in FIG. 5 is a top view showing top of the gas distribution assembly 120 with the susceptor assembly 140 positioned below the plane of the page. For ease of visualization, gas lines and connections to the gas distribution assembly 120 are omitted from this drawing, but it will be understood that there can be any number of gas connections or vacuum connections to the gas distribution assembly. The spacing can vary, for example, each camera 210 may be 120° apart around the circular gas distribution assembly 120 and susceptor assembly 140. Each camera 210 can see the edge 124 of the gas distribution assembly 120, the edge 144 of the susceptor assembly 140 and the gap 170 simultaneously. The image taken from each camera 210 can be processed by the controller 220 and the gap 170 at each camera 210 location can be determined. The controller can determine the plane formed by the susceptor assembly 140 relative to a plane formed by the gas distribution assembly 120. This would allow for the tilt angle, relative to a fixed gas distribution assembly 120, to be calculated. For example, if the gap 170 measured by each of the cameras 210 were identical; there would be substantially no tilt between the susceptor assembly 140 and the gas distribution assembly 120, meaning that the two would be coplanar. Analyzing only the edge of the susceptor cannot guarantee that the entire susceptor is completely flat, so this component would be substantially coplanar, with small regions, possibly, that are not perfectly coplanar.

Multi-camera analysis of the gap may be particularly useful when the susceptor assembly 140 is stationary. The controller can analyze the gap and then send signals to the support post 160 or actuators 162, shown on the bottom in FIG. 1 and on the top in FIG. 3, which can change the size of the gap 170. The controller 220 may include a feedback circuit in communication with at least one gap control actuation device (e.g., the support post 160 or actuators 162). The controller 220 can provide a signal to the at least one gap control actuation device to direct the device to move one or more of the susceptor assembly 140 and the gas distribution assembly 120 to change the size of the gap 170.

In addition to analyzing the stationary susceptor to injector gap 170, the controller can analyze the planarity of the susceptor assembly 140 dynamically. A single camera 210 can be used to record a plurality of images of the gap as the susceptor assembly 140 rotates. The images can be time stamped or correlated to the specific rotational angle of the susceptor assembly 140. Analyzing the gap 170 as a function of the angle or time, the controller can calculate the planarity of the susceptor assembly 140. While only one camera may be used for dynamic measurements of the planarity, multiple cameras can be used as well.

In some embodiments, the gas distribution assembly 120 comprises a reference mark 125 on the edge 124 of the gas distribution assembly 120. The reference mark 125 can be used as a substitute for the front surface 121 of the gas distribution assembly 120 in calculating the gap 170. The reference mark 125, shown in FIG. 3, can be, for example, a groove etched into the edge 124 of the gas distribution assembly 120 at a known distance from the front surface 121 of the gas distribution assembly 120. The image captured by the camera 210 would include the reference mark 125, which may be easier to detect by the controller 220 instead of determining the edge of the gas distribution assembly 120. A similar reference mark can be created on the edge 144 of the susceptor assembly 140 and used in the same fashion. In some embodiments, the controller 220 analyzes an image from the camera 210 in which both reference marks are visible. The spacing between the reference marks, less then distance of the reference marks from the edges of the respective assemblies, would result in the size of the gap 170.

In some embodiments, mounting sensors 230 (e.g., capacitance sensors or eddy current sensors; see FIG. 1) in a fixed injector plate may enable real time 3D mapping of the gap or the surface of the susceptor assembly 140. This may be performed when the wafer carrier plate is stationary, or rotating under the injector assembly. The capacitance sensor heads face the wafer carrier surface, and transmit an electrical signal that is proportional to the distance of the carrier surface from the sensor. Mounting several sensors in different places across the plating area allows for static and dynamic 3D mapping of the separation between the wafer and the gas sources.

A plurality of capacitance sensors 230 can be positioned on the front surface 121 of the gas distribution assembly 120 directed toward the top surface 141 of the susceptor assembly 140. If the capacitance sensors 230 are not perfectly flush with the surface of the gas distribution assembly, then the offset amount can be included in any calculations. The controller 220 can be connected to the plurality of capacitance sensors 230 to determine the gap 170 between the top surface 141 of the susceptor assembly 140 and the front surface 121 of the gas distribution assembly 120 from the electrical signals provided by the plurality of capacitance sensors 230.

In some embodiments, the controller 220 determines the gap 170 between the top surface 141 of the susceptor assembly 140 and the front surface 121 of the gas distribution assembly 120 at each capacitance sensor 230 position while the susceptor assembly 140 remains stationary. With enough sensors 230 placed about the surface of the gas distribution assembly, a detailed 3D mapping of the surface of the susceptor could be obtained.

In one or more embodiments, the controller 220 uses a plurality of measurements from at least one capacitance sensor 230 taken during a processing cycle in which the susceptor assembly 140 rotates. The controller 220 can determine the planarity of a portion of the susceptor assembly 140 adjacent the capacitance sensor 230 from the electrical signals provided by the capacitance sensor 230 during the processing cycle. Analysis of this sort across different portions of the susceptor assembly 140 can provide a detailed map of the planarity of the susceptor assembly as a function of the distance to the edge of the susceptor assembly by determining the planarity of concentric portions of the assembly.

Again, the controller 220 may include one or more feedback circuits in communication with at least one gap control actuation device. With the detailed analysis of the planarity of the susceptor assembly 140, the controller 220 might provide a signal to one or more actuator to move just a portion of the susceptor assembly 140 closer to or further from the injector assembly. This may be particularly useful where the susceptor assembly 140 is made up of a plurality of pie-shaped segments, like the injector assembly of FIG. 2.

Various embodiments of the disclosure are directed to contact based sensors that work within the constraints of space, temperatures, vacuum integrity and cost to determine and adjust the gap at the center of the chamber. In some embodiments, an actuator can be embedded in the center of the showerhead. The actuator can have a broad head at the top with a thin long pin at the bottom. In some embodiments, the actuator head sits at the top on the injector and is pushed down by a spring.

In one or more embodiments, the actuator pin extends by an amount smaller than the predetermined gap beyond the injector at the bottom. An emitter-receiver fixed at the top of the injector look at each other via a through hole through the head of the actuator. As the susceptor pushes the actuator pin up the opening for the light beam might be covered, decreasing the amount of light received by the receiver and decreasing the signal. This decrease in signal, or light attenuation, can be used to determine the amount that the actuator has been pushed up. By knowing the initial position of the lower end of the actuator vis-à-vis the lower surface of the injector plate, the distance of the susceptor from the injector can be determined. In some embodiments, the actuator is spring mounted at the top to move the actuator back to its original position when the susceptor is not touching.

In some embodiments, an O-ring below the actuator head might be included to prevent leak (i.e., form a fluid tight seal) at maximum and minimum compression during operation. This approach can be used, for example, to: determine and adjust the center gap in the process chamber between process fixtures (injector and susceptor); determine the tilt and droop of the susceptor by working with the edge located cameras; and control for variation in height along the process surface of wafer support apparatus/fixture by working in cohort with the cameras.

The proximity sensor of some embodiments can operate at higher temperatures and in smaller spaces than standard optical solutions. Compared to the capacitive and inductive sensors, the proximity sensor is also not prone to electrical / plasma noise within the chamber. Embodiments of the disclosure can make measurements under actual process conditions to routinely confirm and maintain accurate gap control at the center of large process fixtures. Results of such measurement can be fed back to the wafer handling system to automatically maintain optimal wafer placement and gap control.

Figure 6:
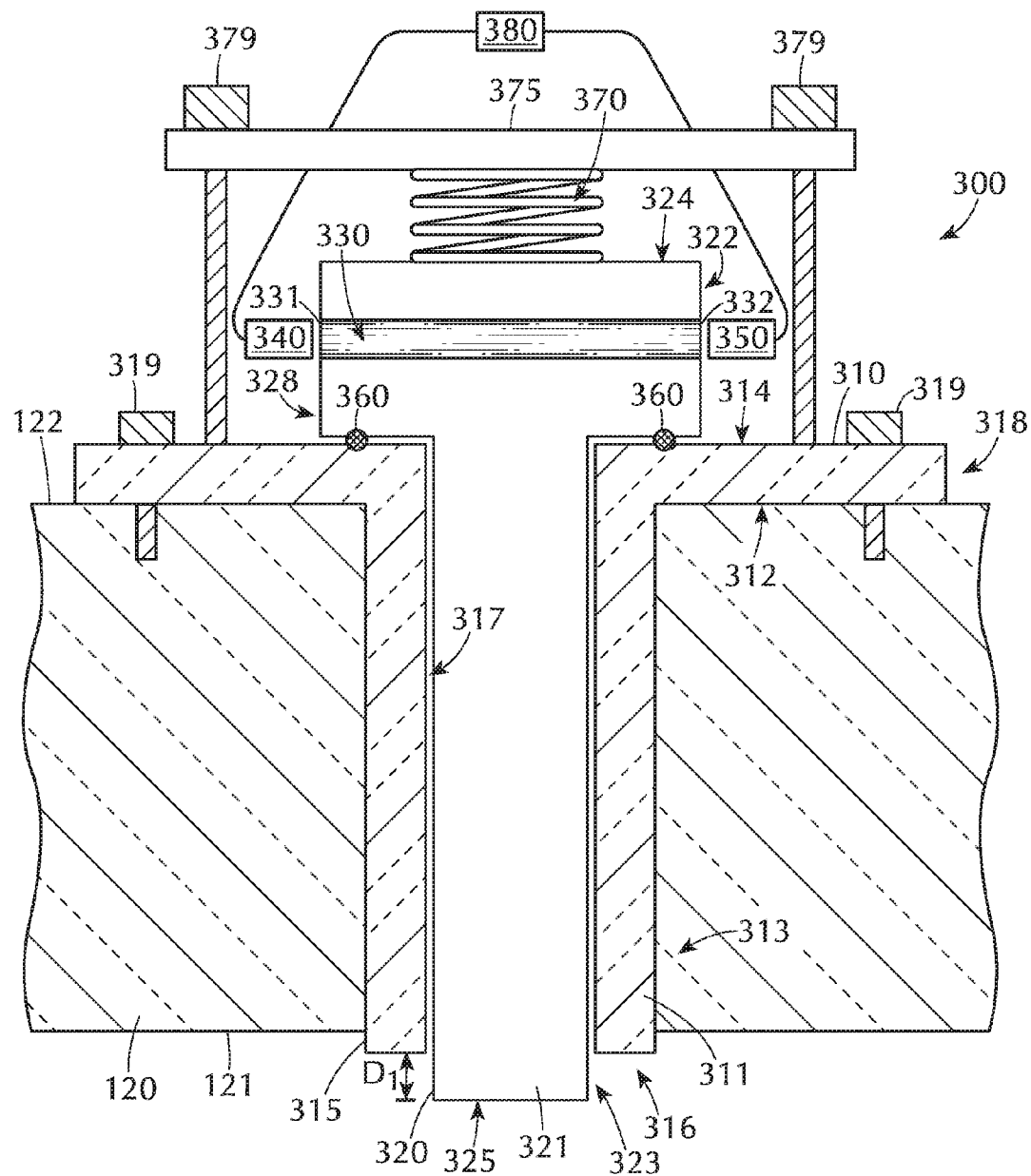
FIG. 6 shows a cross-sectional schematic of an apparatus for measuring a gap between components in accordance with one or more embodiments of the disclosure.

With reference to FIG. 6, an embodiment of the proximity sensor 300 is described. A hardstop 310 has a body 311 with a top portion 312 and a bottom portion 313. The top portion 312 has a top end 314 and the bottom portion has a bottom end 316. An opening 317 extends through the body 311 from the top end 314 to the bottom end 316.

In some embodiments, the top portion 312 has a flange 318 which can be connected to, for example, the gas distribution assembly 120. In the embodiment shown in FIG. 6, the hardstop 310 has a flange 318 that is connected to the front surface 121 of the gas distribution assembly 120 with bolts 319.

The bottom portion 313 of the hardstop 310 can be flush with the front surface 121 of the gas distribution assembly 120. The bottom portion 313 can be recessed within the gas distribution assembly 120. However, in the embodiment shown in FIG. 6, the bottom portion 313 of the hardstop 310 extends beyond the front surface 121 of the gas distribution assembly 120 so that there is a portion 315 that protrudes from the front surface 121. When a surface (e.g., a susceptor) is moved close to the gas distribution assembly 120, the portion 315 that protrudes can protect the front surface 121 of the gas distribution assembly 120. The surface would contact the bottom end 316 of the hardstop 310 which will prevent the surface from getting closer to the front surface 121.

The amount that the bottom portion 313 protrudes, or stated differently, the length of the portion 315 that protrudes, can be anywhere greater than about 0.1 mm. In some embodiments, the portion 315 has a length up to about 1 mm, or in the range of about 0 mm to about 1 mm, or greater than 0 mm to about 1 mm.

An actuator 320 having a body 321 with an upper portion 322 and a lower portion 323. The upper portion 322 has an upper end 324 and the lower portion 323 has a lower end 325. The actuator 320 is slidably positioned within the opening 317 in the hardstop 310. As used in this specification and the appended claims, the term "slidably" means that the actuator can slide within the opening.

The embodiment shown has a visible gap between the actuator 320 and the hardstop 310. The gap can be any size that does not interfere with the pressure in the processing chamber. For a round actuator, the outer diameter can be very close to the inner diameter of the opening 317 so that there is some friction during slidable movement of the actuator.

The cross-sectional shape of the actuator 320 can be, for example, round, square or octagonal. The shape of the actuator 320 generally matches the shape of the opening 317 in the hardstop 310. For example, if the hardstop 310 has an opening that is triangular in cross-section, the actuator 320 body 321 might also have a triangular cross-section. The shape of the actuator 320 is sized to fit within the opening 317 in the hardstop 310. While other description may refer to the actuator 320, hardstop 310, opening 317 or other components as being round, those skilled in the art will understand that other shapes are within the scope of the disclosure.

A passage 330 extends through the upper portion 322 of the body 321 from a first end 331 to a second end 332. The passage 330 can extend through the middle of the cross-sectional shape of the upper portion 322 or off-center. For example, if the upper portion 322 has a round cross-section, the passage 330 may extend radially through the upper portion 322 so that the passage goes through the center of the round cross-section. In some embodiments, the passage 330 extends off-axis through the upper portion 322. For example, in a round upper portion 322, the passage 330 may extend like a chord in a circle connecting any two points on the outer edge of the upper portion 322.

The actuator 320 is sized to extend beyond the bottom end 316 of the hardstop 310 so that the lower end 325 of the actuator 320. Thus, the lower end 325 of the actuator 320 protrudes from the bottom end 316 of the hardstop a first distance D1 when no force is applied to the lower end 325 of the actuator 320. This can be seen in FIG. 7A.

The hardstop 310 and actuator 320 can be made of any suitable material. In some embodiments, both the hardstop 310 and actuator 320 are made of stainless steel. The embodiment shown in FIG. 6 has different shading for the hardstop 310, actuator 320, gas distribution assembly 120, bolts 319, and other components to help illustrate the different components only and does not specify the materials of construction. While each of these components can be made of different materials, it may be useful to have all or some of the components made from the same material. For example, the actuator 320 and the hardstop 310 of some embodiments are made from materials which have similar or identical coefficients of thermal expansion.

An emitter 340 is aligned with the first end 331 of the passage 330 in the actuator 320. A detector 350 is aligned with the second end 332 of the passage 330 in the actuator 320. The emitter 340 can be any suitable component that can interact with the detector 350 to provide a measure of the obstruction caused by a component between the emitter and detector. As used in this specification and the appended claims, "aligned" used in this regard means at some point during the slidable movement of the actuator, the detector will have a direct line of sight to the emitter. The direct line of sight can be partially blocked or completely unblocked by the upper portion 322 of the actuator 320. Suitable examples of emitters 340 include, but are not limited to, lasers and LEDs. Suitable detectors 350 include, but are not limited to, diode arrays and photon counting devices.

Figure 7A:
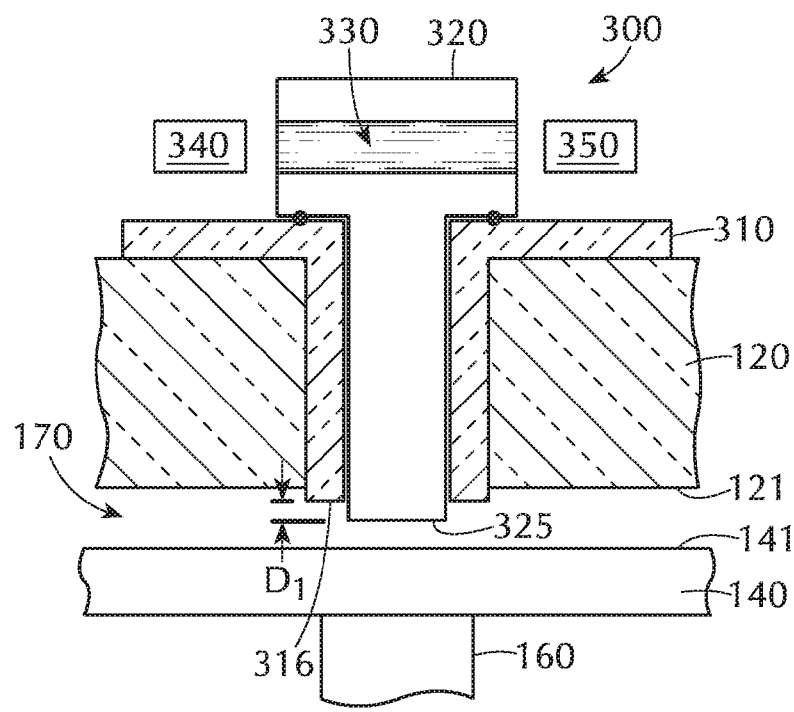
FIGS. 7A and 7B shows a cross-sectional schematic view of the hardstop and actuator in use in accordance with one or more embodiments of the disclosure.
Figure 7B:
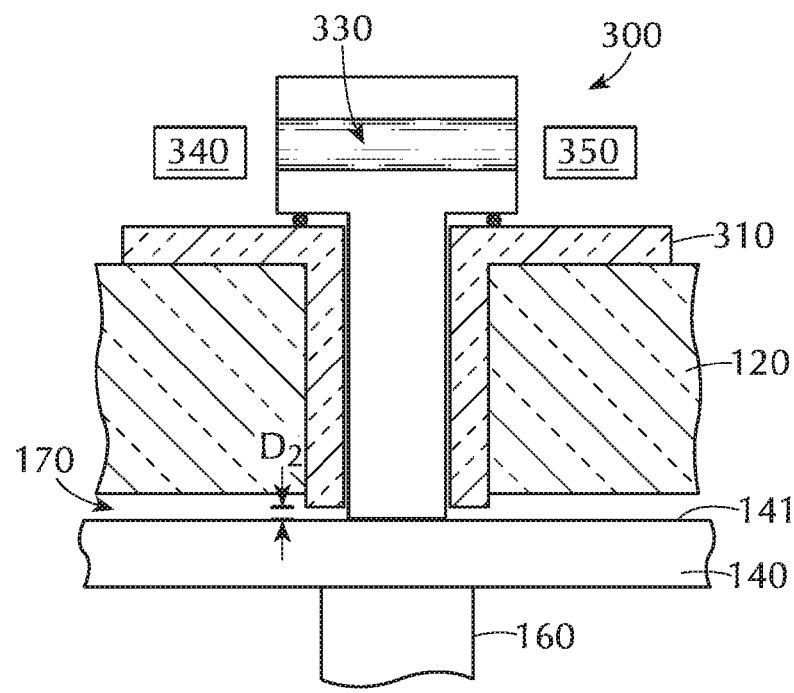

As shown in FIGS. 7A and 7B, movement of the actuator 320 causes the alignment of the emitter 340 and detector 350 relative to the passage 330 to change. In FIG. 7A, the lower end 325 of the actuator 320 is not in contact with the front face 141 of the susceptor assembly 140. Therefore, the lower end 325 protrudes a first distance D1 from the bottom end 316 of the hardstop 310. In the embodiment shown, the passage 330 provides substantially no interference with the line of sight between the emitter 340 and detector 350. As used in this specification and the appended claims, the term "substantially no interference" used in this manner means that less than about 10% of the emitted light is not measured by the detector. At this point, the passage 330 provides a first attenuation to the light from the emitter. As used in this context, the "attenuation" of the light from the emitter means the amount of light that is being blocked by, for example, the upper portion 322 of the actuator 320. An attenuation of zero means that all of the light emitted by the emitter 340 passes through the passage 330.

In FIG. 7B, the susceptor assembly 140 has been raised so that the top surface 141 contacts the lower end 325 of the actuator 320 during travel of the susceptor assembly. The contact causes slidable movement of the actuator 320 upward so that the upper portion 322 of the actuator 320 starts to block the light from the emitter 340 from reaching the detector 350. The passage 330 thus provides a second attenuation to the light because less of the light from the emitter 340 passes through the passage 330. The second attenuation is different from the first attenuation so that a change in the gap 170 can be measured.

In the embodiment shown in FIGS. 7A and 7B, when the actuator 320 protrudes a first distance D1 (FIG. 7A), the first attenuation is less than second attenuation when the actuator protrudes a second distance D2 (FIG. 7B). As shown, the first attenuation is low because the emitter/detector is aligned relative to the passage that most or all of the light can pass through. The second attenuation is much greater, meaning less light will pass through the passage, because part of the upper portion 322 of the actuator 320 blocks the light from the emitter instead of allowing it to pass through the passage 330.

In some embodiments, the emitter 340 and detector 350 are aligned relative to the passage 330 so that when the actuator 320 protrudes by the first distance (i.e., nothing pushing upward against the actuator) the first attenuation is higher than when the actuator 320 is moved upward so that it protrudes the second distance D2. In this situation, when in the D1 position the upper portion 322 of the actuator 320 is blocking some or all of the light from passing through the passage 330. When the gap 170 is decreased so that the actuator 320 is pushed up, the passage 330 becomes better aligned with the emitter/detector. Thus, less of the light from the emitter 340 is blocked from reaching the detector 350 through the passage 330.

Figure 8A:
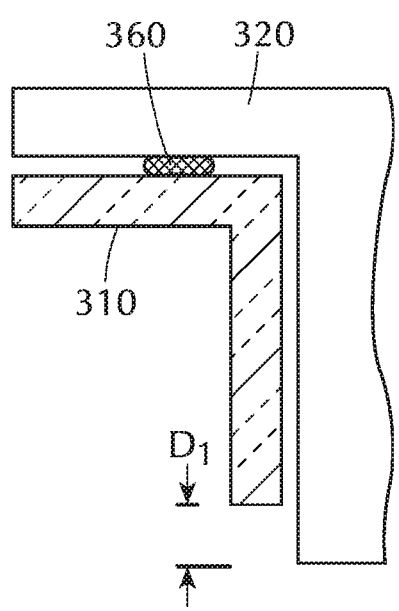
FIGS. 8A and 8B show partial cross-sectional views of an O-ring between the hardstop and actuator during gap adjustment in accordance with one or more embodiments of the disclosure.
Figure 8B:
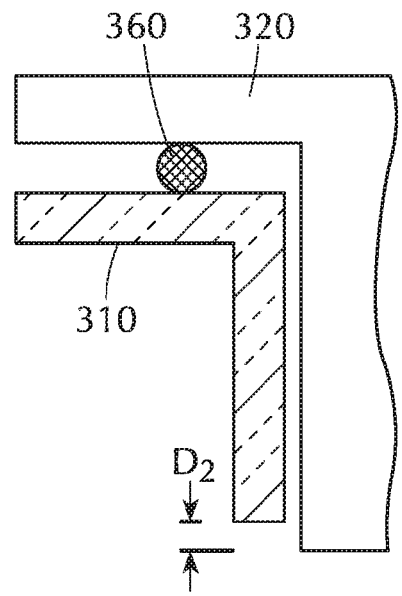

In some embodiments, as shown in FIG. 6, an O-ring 360 is positioned between the actuator 320 and the hardstop 310. In the embodiment shown, the O-ring 360 is between the flange 238 of the actuator and the flange 318 of the hardstop 310. The O-ring 360 helps form a fluid tight seal between the hardstop 310 and the actuator 320. The fluid tight seal of some embodiments is maintained when the actuator moves from extending a first distance D1 to extending a second distance D2. This is illustrated in FIGS. 8A and 8B. In FIG. 8A, the actuator 320 extends the first distance D1. The O-ring 360 is shown as being compressed almost to being flat. When the actuator 320 moves to the position in FIG. 8B, extending the second distance D2, the O-ring 360 is almost completely expanded but continues to maintain the fluid tight seal between the actuator 320 and the hardstop 310. Maintaining the fluid tight seal will help ensure that the processing chamber pressure can be maintained.

Figure 9A:
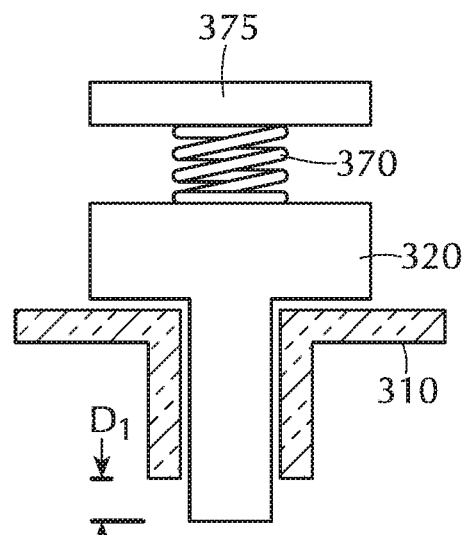
FIGS. 9A and 9B show partial cross-sectional view of a spring between a plate and the actuator during gap adjustment in accordance with one or more embodiments of the disclosure.
Figure 9B:
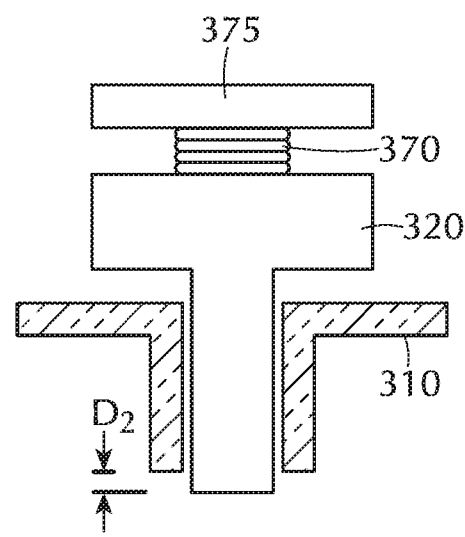

In some embodiments a spring 370 is positioned adjacent to and in contact with the top end 324 of the actuator 320. A plate 375 is positioned adjacent the spring 370 on an opposite side from the actuator 320. The plate 375 provides pressure to the spring to push the actuator 320 downward. In some embodiments, when the actuator protrudes the second distance D2, the spring 370 is at maximum compression. In some embodiments, when the actuator 320 protrudes the first distance D1, the spring 370 is not at maximum compression. This can be seen in FIG. 9A and 9B. In FIG. 9A, the spring 370 is expanded, that is, not fully compressed. The spring 370 may be in a compressionless state or partially compressed. In FIG. 9B, when the actuator is at the second distance D2, the spring 370 has been fully compressed and the actuator 320 may not be able to move further. In some embodiments, when the spring is at maximum compression (FIG. 9B) the actuator 320 protrudes from the bottom end of the hardstop 310 at least about 0.1 mm.

In the embodiment shown in FIG. 6, the plate 375 is attached to the flange 318 of the hardstop 310 by bolts 379.

In some embodiments, the top portion 312 of the hardstop 310 has a flange 318 that is connected to the plate with a distance between the plate and hardstop sufficient so that when the spring 370 is at maximum compression, the lower end of the actuator 320 protrudes from the bottom end of the hardstop 310 a second distance in the range of about 0.1 mm to about 1.2 mm.

The embodiment of FIG. 6 includes a controller 380 with a feedback circuit that can be used to measure the gap between the gas distribution assembly and the susceptor assembly. The controller 380 is shown in communication with the emitter 340 and detector 350 but may also be in communication with a motor that lifts the susceptor assembly. Thus, the controller 380 and feedback circuit can measure the light passing from emitter to detector as the size of the gap decreases. When the gap has been adjusted to the predetermined amount, as determined by the emitter/detector combination, the feedback circuit can stop moving the susceptor assembly.

Some embodiments of the disclosure are directed to methods of adjusting the gap between a susceptor assembly and a gas distribution assembly. Referring to FIGS. 7A and 7B, the proximity sensor 300 including the hardstop 310 and actuator 320 are positioned within an opening in the gas distribution assembly so that the lower end 325 of the actuator 320 extends a first distance D1 from the bottom of the hardstop 310 into the gap 170 between the gas distribution assembly 120 and the susceptor assembly 140. An amount of light transmitted from an emitter 340 through a passage 330 to a detector 350 is measured. The measurement can be made using any suitable technique including, but not limited to, a controller 380. The passage 330 attenuates the light from the emitter providing a first attenuation. In the embodiment of FIG. 7A, the first attenuation causes substantially no interference with the light from emitter 340 from passing through passage 330 to the detector 350.

The susceptor assembly 140 and gas distribution assembly 120 are moved closer together to decrease the gap 170. Either the gas distribution assembly 120 or the susceptor assembly 140, or both, can be moved to decrease the size of the gap 170. As the gap decreases, the top surface 141 of the susceptor assembly 140 contacts the lower end 325 of the actuator 320 pushing the actuator upward decreasing the distance that the actuator extends from the bottom of the hardstop 310. As the first distance D1 is decreased to the second distance D2, shown in FIG. 7B, the passage 330 moves relative to the emitter 340 and detector 350. The passage 330 attenuates the light from the emitter 340 providing a second attenuation different from the first attenuation. The detector can be used to measure the light from the emitter through the second attenuation.

The gap 170 can be determined from the detector 350 measurements. The amount of light detected with the second attenuation can be compared to, for example, a lookup table in the controller 380 to determine the gap 170 measured at the actuator 320. Thus, the gap 170 between the gas distribution assembly 120 and the susceptor assembly 140 can be determined based on the first amount of light measured when the passage 330 provides a first attenuation and the second amount of light measured when the passage 330 provides a second attenuation.

The topology of the susceptor assembly can also be measured using the actuator 320 and at least one camera 210 positioned adjacent the susceptor assembly 140. The gap 170 at the actuator 320 is measured using the second attenuation from the passage 330. The edges of the susceptor assembly 140 may droop or tilt relative to the center. By positioning at least one camera adjacent the susceptor assembly so that the edge 124 of the gas distribution assembly 120 and the edge 144 of the susceptor assembly 140 are in the field of view 211 of the camera 210. An image of the field of view 211 from the camera 210 is used to determine the location of the front surface 121 of the gas distribution assembly 120 and the top surface 141 of the susceptor assembly 140 and, therefore, the gap 170 between. Measuring the gap 170 at multiple locations with one or more cameras 210 can be used to determine the topology (i.e., tilt or droop) of the susceptor.

While the foregoing is directed to embodiments of the present disclosure, other and further embodiments of the disclosure may be devised without departing from the basic scope thereof, and the scope thereof is determined by the claims that follow.

What is claimed is:

1. A deposition apparatus comprising:
a gas distribution assembly having a front surface, a back surface and an edge;
a susceptor assembly spaced from the gas distribution assembly to rotate a plurality of substrates around a central axis, the susceptor assembly having a top surface with a plurality of recesses to hold a plurality of substrates, a bottom surface and an edge, wherein the top surface of the susceptor assembly and the front surface of the gas distribution assembly defining a gap;
a camera having a field of view including the edge of the susceptor assembly;
a controller connected to the camera to determine the gap between the top surface of the susceptor assembly and the front surface of the gas distribution assembly; and
a hardstop having a hardstop body with a top portion with a top end, a bottom portion with a bottom end and an opening extending from the top end to the bottom end, the top portion of the hardstop comprising a flange;
an actuator having an actuator body with an upper portion with an upper end and a lower portion with a lower end, the upper portion having a passage extending through the actuator body, the passage having a first end and a second end, the actuator sized to be slidably positioned within the opening of the hardstop so that the lower end of the actuator protrudes from the bottom end of the hardstop a first distance when no force is applied to the lower end of the actuator;
an emitter aligned with the first end of the passage in the actuator;
a detector aligned with the second end of the passage in the actuator;
a spring positioned adjacent the top end of the actuator and a plate positioned adjacent the spring,
wherein the plate is bolted to the flange of the hardstop and provides pressure to the spring, the flange on the hardstop is connected to the back surface of the gas distribution assembly and the bottom end of the hardstop extends through the gas distribution assembly and protrudes from the front surface of the gas distribution assembly.

2. The deposition apparatus of claim 1, further comprising an O-ring between the hardstop and the actuator, the O-ring forming a fluid tight seal between the hardstop and the actuator.

3. The deposition apparatus of claim 1, wherein pressure applied to the lower end of the actuator causes the actuator to slide within the opening in the hardstop so that the spring is at maximum compression and the lower end of the actuator protrudes from the bottom end of the hardstop a second distance shorter than the first distance.

4. The deposition apparatus of claim 3, wherein when the spring is at maximum compression, the lower end of the actuator protrudes from the bottom end of the hardstop at least 0.1 mm.

5. The deposition apparatus of claim 3, wherein movement of the actuator causes the alignment of the emitter and detector relative to the passage to change.

6. The deposition apparatus of claim 5, wherein when the lower end of the actuator protrudes from the hardstop by the first distance, the emitter and detector are aligned relative to the passage so that the passage provides a first attenuation to light from the emitter being detected by the detector and when the actuator protrudes by the second distance, the passage provides a second attenuation to the light from the emitter being detected by the detector so that the first attenuation is different from the second attenuation.

7. The deposition apparatus of claim 6, wherein when the actuator protrudes by the first distance, the first attenuation is less than the second attenuation when the actuator protrudes by the second distance.

8. The deposition apparatus of claim 6, wherein when the actuator protrudes by the first distance, the first attenuation is greater than the second attenuation when the actuator protrudes by the second distance.

9. The apparatus of claim 1, wherein the controller comprises a feedback circuit that measures the gap between the gas distribution assembly and the susceptor assembly.

* * * * *